United States Patent
Norkus et al.

(10) Patent No.: US 9,428,836 B2
(45) Date of Patent: Aug. 30, 2016

(54) ELECTROLESS DEPOSITION OF CONTINUOUS COBALT LAYER USING COMPLEXED $Ti^{3+}$ METAL IONS AS REDUCING AGENTS

(71) Applicant: Lam Research Corporation, Fremont, CA (US)

(72) Inventors: Eugenijus Norkus, Vilnius (LT); Ina Stankeviciene, Vilnius (LT); Aldona Jagminiene, Vilnius (LT); Aniruddha Joi, Fremont, CA (US); Loreta Tamasauskaite-Tamasiunaite, Vilnius (LT); Yezdi Dordi, Palo Alto, CA (US); Zita Sukackiene, Vilnius (LT)

(73) Assignee: Lam Research Corporation, Fremont, CA (US)

( * ) Notice: Subject to any disclaimer, the term of this patent is extended or adjusted under 35 U.S.C. 154(b) by 7 days.

(21) Appl. No.: 14/264,994

(22) Filed: Apr. 29, 2014

(65) Prior Publication Data

US 2015/0307993 A1     Oct. 29, 2015

(51) Int. Cl.
*C23C 18/31* (2006.01)
*C23C 18/16* (2006.01)
*H01L 21/288* (2006.01)

(52) U.S. Cl.
CPC ............. *C23C 18/31* (2013.01); *C23C 18/165* (2013.01); *H01L 21/288* (2013.01)

(58) Field of Classification Search
None
See application file for complete search history.

(56) References Cited

U.S. PATENT DOCUMENTS

| | | | |
|---|---|---|---|
| 5,160,373 A | 11/1992 | Senda et al. | |
| 5,364,459 A | 11/1994 | Senda et al. | |
| 6,338,787 B1 | 1/2002 | Obata et al. | |
| 2006/0264043 A1* | 11/2006 | Stewart et al. | 438/678 |
| 2008/0085370 A1* | 4/2008 | Thie et al. | 427/437 |
| 2008/0090414 A1* | 4/2008 | Chen et al. | 438/678 |
| 2010/0065101 A1* | 3/2010 | Zaban | H01G 9/2031 136/244 |
| 2010/0075498 A1* | 3/2010 | Takagi et al. | 438/678 |
| 2012/0104331 A1* | 5/2012 | Kolics | 252/513 |

* cited by examiner

*Primary Examiner* — Khaja Ahmad
(74) *Attorney, Agent, or Firm* — Beyer Law Group LLP

(57) ABSTRACT

A solution for electroless deposition of cobalt is provided. A reducing agent of $Ti^{3+}$ ions is provided to the solution. $Co^{2+}$ ions are provided to the solution.

20 Claims, 2 Drawing Sheets

ELECTROLESS DEPOSITION OF CONTINUOUS COBALT LAYER USING COMPLEXED $Ti^{3+}$ METAL IONS AS REDUCING AGENTS

BACKGROUND OF THE INVENTION

Field of the Invention

The invention relates to a method of forming semiconductor devices on a semiconductor wafer. More specifically, the invention relates to depositing cobalt layers to form semiconductor devices.

In forming semiconductor devices, thin layers of cobalt may be deposited. Such a deposition may be provided by electroless plating.

SUMMARY OF THE INVENTION

To achieve the foregoing and in accordance with the purpose of the present invention, a solution for electroless deposition of cobalt is provided. A reducing agent of $Ti^{3+}$ ions is provided to the solution. $Co^{2+}$ ions are provided to the solution.

In another manifestation of the invention, a method for providing an electroless plating of a cobalt containing layer is provided. A $Ti^{3+}$ concentrated stock solution is provided. A $Co^{2+}$ concentrated stock solution is provided. A flow from the $Ti^{3+}$ concentrated stock solution is combined with a flow from the $Co^{2+}$ concentrated stock solution and water to provide a mixed electrolyte for electrolessly depositing Co. A substrate is exposed to the mixed electrolyte for electrolessly depositing Co.

In another manifestation of the invention, a method for providing an electroless plating of a cobalt layer is provided. A solution for electroless deposition of cobalt is provided, comprising $Ti^{3+}$ ions and $Co^{2+}$ ions, wherein a ratio of $Ti^{3+}$ ions to $Co^{2+}$ ions is between 5:1 and 1:5. A substrate is exposed to the solution for electroless deposition of cobalt.

These and other features of the present invention will be described in more details below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

Figure 1:
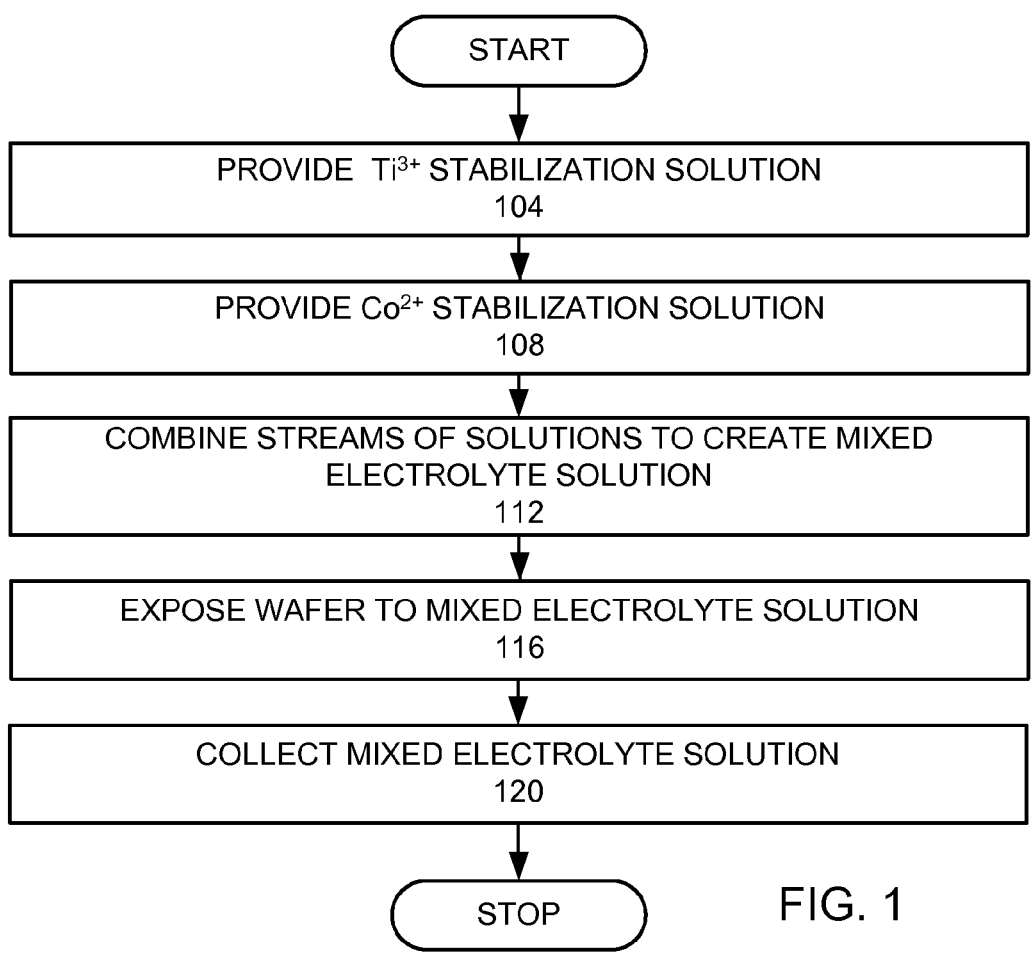
FIG. 1 is a flow chart of an embodiment of the invention.

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

In electroless deposition (ELD) on difficult to plate substrates, activation of the substrate using Co containing solutions prior to deposition is important. This may be accomplished by simply dipping the solution in a $CoCl_2$ aqueous solution or other soluble salts. $Co^{2+}$ ions adsorb on the substrate creating an active surface which may or may not have a uniform Co surface coverage after reduction. This gives rise to non-homogeneous nucleation which is undesirable in semiconductor applications. Hence, ability to deposit a thin, continuous Co layer on noble substrates, prior to plating, is important. Co can be deposited by ELD. Electroless deposition of cobalt is accomplished using hydrazine or other hydrogen containing compounds as reducing agents. In addition to the environmental concerns associated with these hydrogen containing reducing agents, the oxidation reaction of these species involves generation of $H_2$ gas which is incorporated in the deposit. This impacts the purity of the deposited film. Additionally, the hydrazine-cobalt electrolyte requires operation at an elevated temperature and high pH. These are undesirable for application in back end metallization as the dielectric materials are prone to damage at high pH and temperature.

In electroless plating bath containing $Ti^{3+}$, the metal to be deposited, $Co^{2+}$, is reduced from the solution while $Ti^{3+}$ is oxidized to higher, more stable oxidation states. $Ti^{3+}$ has significant benefits over hydrazine and other hydrogen containing compounds in resolving the issues specified earlier.

Replacing hydrazine with $Ti^{3+}$ ion reducing agents eliminates the toxicity and volatility that is inherent to hydrazine and makes the plating bath more environmentally friendly. Additionally, no gas evolution (i.e. $H_2$ and $N_2$) or side reaction is observed at the electrode. This results in a smooth, continuous, pure Co film. The metal ion containing plating baths can also be operated over a wide temperature and pH range.

The inventive metal ion reducing agents containing bath is operable at room temperature and lower pH. This is not possible with the hydrazine and other reducing agent containing electrolyte. The extended window of operation makes this bath attractive for application in semiconductor applications In addition, this embodiment allows the formation of a very thin, continuous Co film on substrates that can be used as a catalyst layer for subsequent ELD of different metals such as Cu, Ni, etc. In addition, this embodiment provides an environmentally friendly and 'greener' alternative to hydrazine based electroless Co electrolytes which are highly toxic and unstable.

Gas evolution (mainly hydrogen and/or nitrogen) which is a byproduct of the hydrazine oxidation reaction is eliminated by the titanium oxidation reaction. Deposition of a pure, continuous Co film is possible.

The cost and complexity associated with maintaining a high temperature during plating can also be reduced due to near room temperature operation of the metal ion reducing agents electrolyte.

The table below describes a formulation of the $Ti^{3+}$/Co electroless plating bath. The deposition was done on Cu substrates without any activation. Deposition can be extended to non conductive or poorly conducting substrates such as glass, and 1~2 nm Ru by following proper pre-clean protocols.

| Species | Concentration (M) |
| --- | --- |
| $CoSO_4$ | 0.025 |
| NaOH | 0.075 |
| Sodium Gluconate | 0.025 |
| $NH_4OH$ | 0.32 |
| $TiCl_3$ | 0.05 |

| Species | Concentration (M) |
| --- | --- |
| Ascorbic Acid | 0.22 |
| Temperature | 20°-25° C. |
| pH | 7 |

The $Ti^{3+}$ metal ion reducing agent containing bath, used in an embodiment of the invention, is operable below room temperature and with a low pH. This is not possible with the hydrazine and other reducing agent containing electrolyte.

Formation of Co electrodes for memory applications using plasma etching is difficult. An embodiment of the invention enables selective patterning of Co electrodes in semiconductor manufacturing without using plasma etching. The cost and complexity associated with maintaining a high temperature during plating can also be reduced due to near room temperature operation of the $Ti^{3+}$ metal ion reducing agent electrolyte.

FIG. 1 is a high level flow chart of an embodiment of the invention. In this embodiment, a $Ti^{3+}$ concentrated stock solution is provided (step 104). A $Co^{2+}$ concentrated stock solution is provided (step 108). A flow from the $Ti^{3+}$ concentrated stock solution is combined with a flow from the $Co^{2+}$ concentrated stock solution and water to provide a mixed electrolyte solution of the $Ti^{3+}$ concentrated stock solution and the $Co^{2+}$ concentrated stock solution (step 112). A wafer is exposed to the mixed electrolyte solution of the $Ti^{3+}$ concentrated stock solution and the $Co^{2+}$ concentrated stock solution (step 116). The mixed electrolyte solution is collected and may be reactivated for future use or disposed (step 120).

Figure 2:
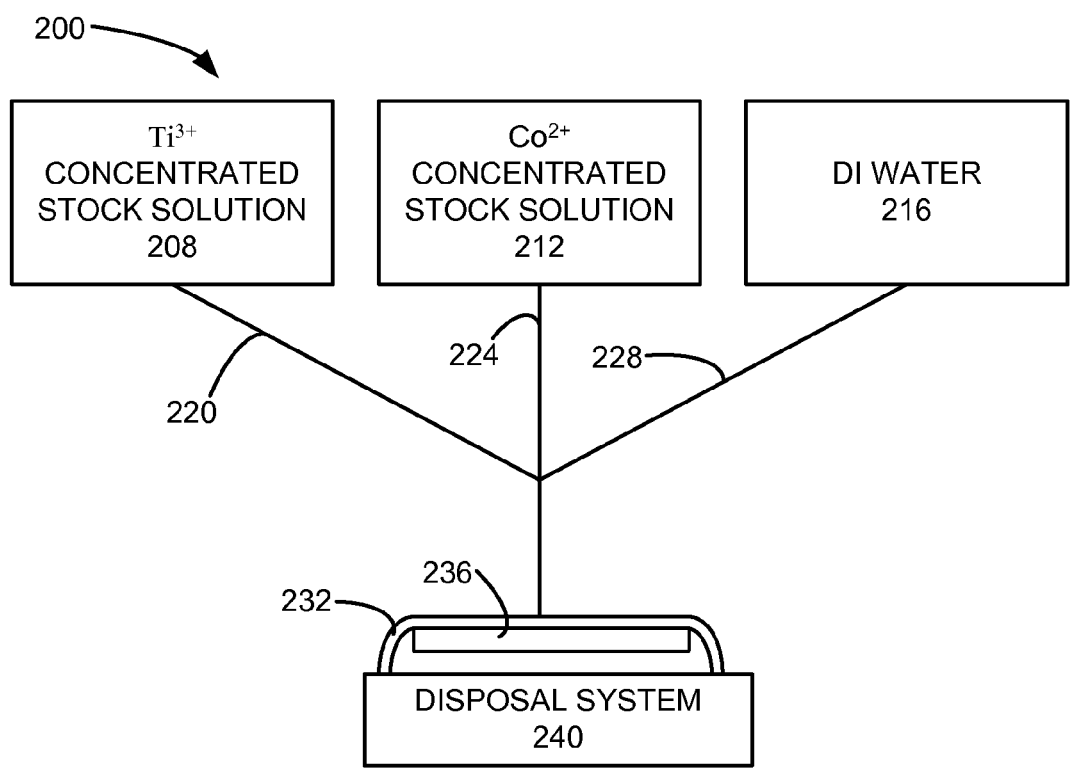
FIG. 2 is a schematic view of a system that may be used in an embodiment of the invention.

In an example, a $Ti^{3+}$ concentrated stock solution is provided in a $Ti^{3+}$ concentrated stock solution source (step 104). A $Co^{2+}$ concentrated stock solution is provided in a $Co^{2+}$ concentrated stock solution source (step 108). FIG. 2 is a schematic view of a system 200 that may be used in an embodiment of the invention. The system comprises a $Ti^{3+}$ concentrated stock solution source 208 containing a $Ti^{3+}$ concentrated stock solution, a $Co^{2+}$ concentrated stock solution source 212 containing a $Co^{2+}$ concentrated stock solution, and a deionized water (DI) source 216 containing DI. A flow 220 from the $Ti^{3+}$ concentrated stock solution source 208 is combined with a flow 224 from the $Co^{2+}$ concentrated stock solution source 212 and a flow 228 from the DI water source 216 to provide a mixed electrolyte solution 232 of the $Ti^{3+}$ concentrated stock solution and the $Co^{2+}$ concentrated stock solution (step 112). A wafer 236 is exposed to the mixed electrolyte solution 232 of the $Ti^{3+}$ concentrated stock solution and the $Co^{2+}$ concentrated stock solution (step 116). The mixed electrolyte solution 232 is collected (step 120). A disposal system 240 may be used to dispose the mixed electrolyte solution 232. An alternative embodiment provides the collection of the mixed electrolyte solution 232, which is reactivated.

In this example, the $Ti^{3+}$ concentrated stock solution comprises a $TiCl_3$ solution with ascorbic acid. The $Co^{2+}$ concentrated stock solution comprises $CoSO_4$, sodium gluconate, and ammonium hydroxide.

In one embodiment, the flow 220 of the $Ti^{3+}$ concentrated stock solution is combined with the flow 224 of the $Co^{2+}$ concentrated stock solution and the flow 228 of DI water, to form a mixed electrolyte solution of 0.05M $TiCl_3$, 0.32M $NH_4OH$, 0.025M $CoSO_4$, 0.075M NaOH, 0.22M ascorbic acid, and 0.025M Sodium Gluconate. The mixed electrolyte solution has a pH of 7 and a temperature of about 20°-25° C.

The $Ti^{3+}$ concentrated stock solution provides a stable $Ti^{3+}$ solution that has a shelf life of several months without degrading. The high concentration allows the $Ti^{3+}$ concentrated stock solution to be stored in a smaller volume. In addition, the $Co^{2+}$ concentrated stock solution provides a stable $Co^{2+}$ solution that has a shelf life of several months without degrading. The high concentration allows the $Co^{2+}$ concentrated stock solution to be stored in a smaller volume. The solutions are combined and diluted just prior to exposing the wafer to the mixed electrolyte solution, since the mixed electrolyte solution does not have as long a shelf life as the concentrated stock solutions.

This embodiment of the invention provides a cobalt containing layer with a thickness of between 1 nm and 30 nm. Preferably, the cobalt containing layer is pure cobalt. Because the cobalt containing layer is relatively thin, a dilute bath is sufficient. In one embodiment, the wafer is exposed to a continuous flow of the mixed electrolyte solution. In another embodiment, the wafer is placed in a still bath of the mixed electrolyte solution for a period of time. Since the concentration of cobalt and titanium is very low in the mixed electrolyte solution, in one embodiment, the mixed electrolyte solution may be disposed (step 120) after being exposed to the wafer, since the low concentration means that only a small amount of cobalt and titanium is discarded. In another embodiment, the mixed electrolyte solution is recycled after being exposed to the wafer. The recycling may be accomplished through reactivation of the mixed electrolyte solution.

The table below describes a formulation of a $Ti^{3+}$/Co electroless plating bath provided in another embodiment of the invention.

| Species | Concentration (M) |
| --- | --- |
| $CoSO_4$ | 0.076 |
| NaOH | 0.91 |
| MethoxyAcetic Acid | 0.076 |
| $NH_4OH$ | 0.32 |
| $TiCl_3$ | 0.05 |
| Citric Acid | 0.23 |
| Temperature | 20°-25° C. |
| pH | 9.3 |

Generally the solution mixture used for plating has $Ti^{3+}$ and $Co^{2+}$ ions at a $Ti^{3+}$ to $Co^{2+}$ ion ratio between 10:1 and 1:10. More preferably, the solution mixture used for plating has $Ti^{3+}$ and $Co^{2+}$ ions at a $Ti^{3+}$ to $Co^{2+}$ ion ratio between 5:1 and 1:5. Preferably, the solution mixture has a ratio of amine ligands to $Ti^{3+}$ is between 12:1 and 3:1. In addition, the solution mixture has Gluconate from Sodium Gluconate or Gluconic acid. In addition, the $Co^{2+}$ ions come from $CoCl_2$ or $CoSO_4$. The $NH_4^+$ ions, which provide the amine ligands, come from $NH_4OH$. Without being limited by theory, it is believed that amine ligands help to provide a lower temperature and lower pH cobalt deposition.

Generally, a wafer or other plating surface is exposed to the solution mixture at a temperature between 20°-25° C. A plating surface is a surface on which the cobalt containing layer is selectively deposited. Such selective deposition may use a mask to protect surfaces where deposition is not desired. Preferably, the solution mixture has a pH from 6 to 10. Preferably, the solution mixture provides $Ti^{3+}$ with a concentration between 0.001-0.500 M. More preferably, the solution mixture provides $Ti^{3+}$ with a concentration between 0.010 to 0.100 M. Most preferably, the solution mixture provides $Ti^{3+}$ with a concentration between 0.020-0.060 M.

The lower temperature and lower pH provide a deposition with less damage to layers provided by the semiconductor fabrication process. In addition, such a process does not require any activation step that might attack and damage the copper substrate. In addition, such a process does not create a gas byproduct.

Preferably, the solution mixture is boron free. Preferably, the solution mixture is phosphorus free. Preferably, the solution mixture is hydrazine free. Preferably, the solution mixture is formaldehyde free. It has been found that providing a solution mixture that is boron, phosphorus, hydrazine, and formaldehyde free allows for a more pure plating that does not have impurities provided by using boron-containing reducing agents, phosphorus-containing reducing agents, hydrazine, or formaldehyde. In addition, avoiding using hydrazine provides a safer and more environmentally friendlier process.

In other embodiments, the source of $Ti^{3+}$ is $Ti_2(SO_4)_3$ or other soluble salts of $Ti^{3+}$. Ascorbic acid can be displaced by tartaric acid, sodium salts of the isomers of sodium citrate or citric acid. Sodium gluconate or gluconic acid can be replaced with methoxyacetic acid or other carboxylic acid ligands.

In one embodiment, the deposited cobalt containing layer is at least 99.9% pure cobalt. More preferably, the deposited cobalt containing layer is pure cobalt.

While this invention has been described in terms of several preferred embodiments, there are alterations, permutations, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A solution for electroless deposition of cobalt, comprising:
    a complexed reducing agent of $Ti^{3+}$ ions; and
    $Co^{2+}$ ions, wherein the solution further comprises amine ligands.

2. The solution, as recited in claim 1, further comprising at least one of gluconate or tartrate ions or methoxyacetate ions.

3. The solution, as recited in claim 2, wherein the solution has a pH between 6 and 10, inclusive.

4. The solution, as recited in claim 1, wherein a continuous cobalt layer of at least 99.9% purity is deposited.

5. The solution, as recited in claim 1, wherein a ratio of $Ti^{3+}$ to $Co^{2+}$ ion is between 1:5 and 5:1.

6. The method, as recited in claim 1, wherein the solution is boron, phosphorus, hydrazine, and formaldehyde free.

7. A method for providing an electroless plating of a cobalt containing layer, comprising:
    providing a $Ti^{3+}$ concentrated stock solution;
    providing a $Co^{2+}$ concentrated stock solution;
    combining a flow from the $Ti^{3+}$ concentrated stock solution with a flow from the $Co^{2+}$ concentrated stock solution and water to provide a mixed electrolyte for electrolessly depositing Co; and
    exposing a substrate to the mixed electrolyte for electrolessly depositing Co;
    wherein exposing the wafer to the mixed electrolyte for electrolessly depositing Co, comprises:
        providing a solution temperature between 20° to 25° C., inclusive; and
        providing a pH of between 6 and 10, inclusive.

8. The method, as recited in claim 7, wherein the cobalt containing layer is at least 99.9% pure cobalt.

9. The method, as recited in claim 7, wherein the $Ti^{3+}$ concentrated stock solution comprises a solution comprising $TiCl_3$.

10. The method, as recited in claim 9, wherein the $Co^{2+}$ concentrated stock solution comprises a solution of $CoSO_4$ and ammonium hydroxide.

11. The method, as recited in claim 10, wherein the $Co^{2+}$ concentrated stock solution has a shelf life of over a month.

12. The method, as recited in claim 11, wherein the $Ti^{3+}$ concentrated stock solution has a shelf life of over a month.

13. The method, as recited in claim 10, wherein the mixed electrolyte solution is boron, phosphorus, hydrazine, and formaldehyde free.

14. The method, as recited in claim 7, wherein the mixed electrolyte solution is boron, phosphorus, hydrazine, and formaldehyde free.

15. A method for providing an electroless plating of a cobalt layer, comprising:
    providing a solution for electroless deposition of cobalt, comprising:
        $Ti^{3+}$ ions; and
        $Co^{2+}$ ions, wherein a ratio of $Ti^{3+}$ ions to $Co^{2+}$ ions is between 5:1 and 1:5; and
    exposing a substrate to the solution for electroless deposition of cobalt, wherein the solution further comprises amine ligands.

16. The method, as recited in claim 15, wherein the providing the solution, provides the solution at a pH of between 6 and 10, inclusive, and at a temperature between 20° to 25° C., inclusive.

17. The method, as recited in claim 15, wherein the cobalt layer is at least 99.9% pure cobalt.

18. The method of claim 17, wherein the solution is boron, phosphorus, hydrazine, and formaldehyde free.

19. The method of claim 15, wherein the solution is boron, phosphorus, hydrazine, and formaldehyde free.

20. The method as recited in claim 15, wherein the solution is boron, phosphorus, hydrazine, and formaldehyde free; wherein the cobalt layer is at least 99.9% pure cobalt, and wherein the providing the solution comprises providing the solution at a pH of between 6 and 10, inclusive, and at a temperature between 20° to 25° C., inclusive.

* * * * *